(12) United States Patent
Ghodsian et al.

(10) Patent No.: US 11,430,612 B2
(45) Date of Patent: Aug. 30, 2022

(54) MEMS TUNABLE CAPACITOR COMPRISING AMPLIFIED PIEZO ACTUATOR AND A METHOD FOR MAKING THE SAME

(71) Applicant: Ostendo Technologies, Inc., Carlsbad, CA (US)

(72) Inventors: Bahram Ghodsian, San Diego, CA (US); Hussein El-Ghoroury, Carlsbad, CA (US)

(73) Assignee: Ostendo Techologies, Inc., Carlsbad, CA (US)

( * ) Notice: Subject to any disclaimer, the term of this patent is extended or adjusted under 35 U.S.C. 154(b) by 320 days.

(21) Appl. No.: 16/822,652

(22) Filed: Mar. 18, 2020

(65) Prior Publication Data

US 2020/0388440 A1 Dec. 10, 2020

Related U.S. Application Data

(60) Provisional application No. 62/822,637, filed on Mar. 22, 2019.

(51) Int. Cl.
*H01G 5/011* (2006.01)
*B81B 3/00* (2006.01)
*H01L 41/047* (2006.01)
*H01L 41/083* (2006.01)

(52) U.S. Cl.
CPC ............ *H01G 5/011* (2013.01); *B81B 3/0021* (2013.01); *H01L 41/047* (2013.01); *H01L 41/083* (2013.01); *B81B 2201/0221* (2013.01)

(58) Field of Classification Search
CPC . H01G 5/011; H01G 5/18; H01G 5/16; H01L 41/047; H01L 41/083; B81B 2201/032; B81B 2203/051; B81B 2203/035
See application file for complete search history.

(56) References Cited

U.S. PATENT DOCUMENTS

2009/0115292 A1* 5/2009 Ueda ................... H02N 2/043
310/338
2012/0043188 A1* 2/2012 Goossens ............. B81B 3/0078
29/622

* cited by examiner

*Primary Examiner* — Jeffrey M Shin
(74) *Attorney, Agent, or Firm* — W. Eric Boyd, Esq.; Greg Caldwell, Esq.

(57) ABSTRACT

A micromachined tunable capacitor. A pair of first and second MEMS fabricated flexures are flexibly coupled to a piezo actuator drive element configured wherein a stress or strain induced by the piezo actuator drive element urges a first movable capacitor plate element a predetermined distance toward or away from a second capacitor plate element proportional to a predetermined voltage signal.

9 Claims, 14 Drawing Sheets

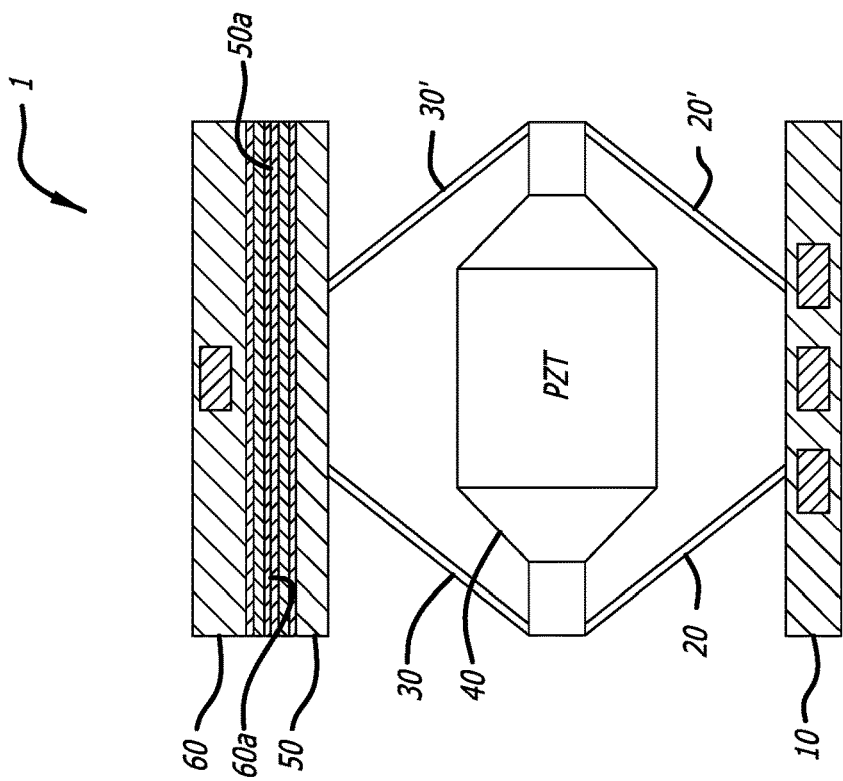
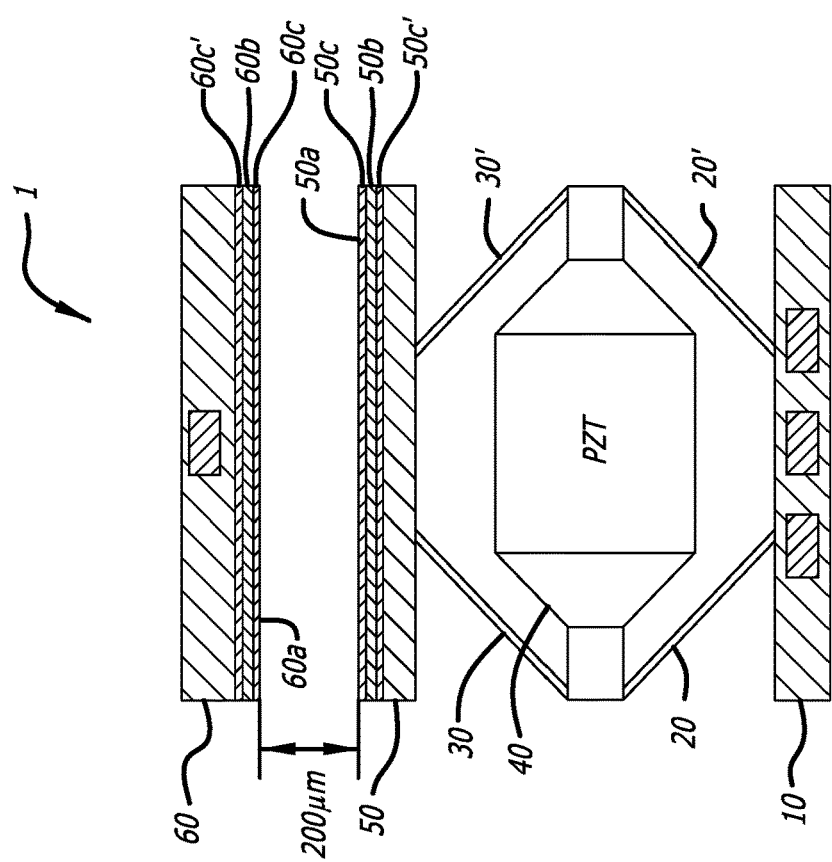
FIG. 1A
FIG. 1B

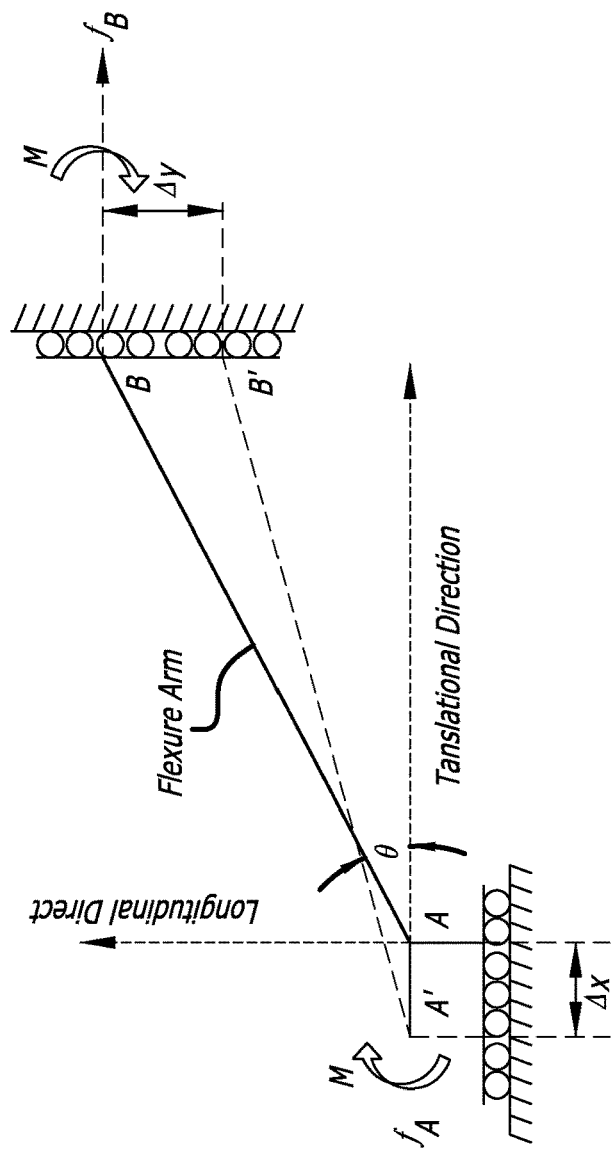
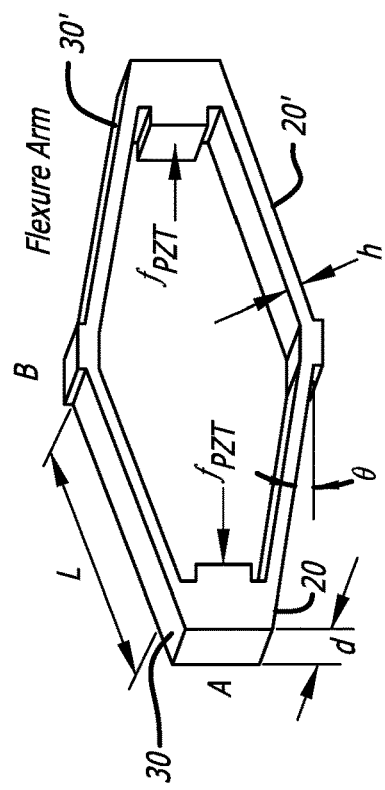
FIG. 2A
FIG. 2B (Prior Art)

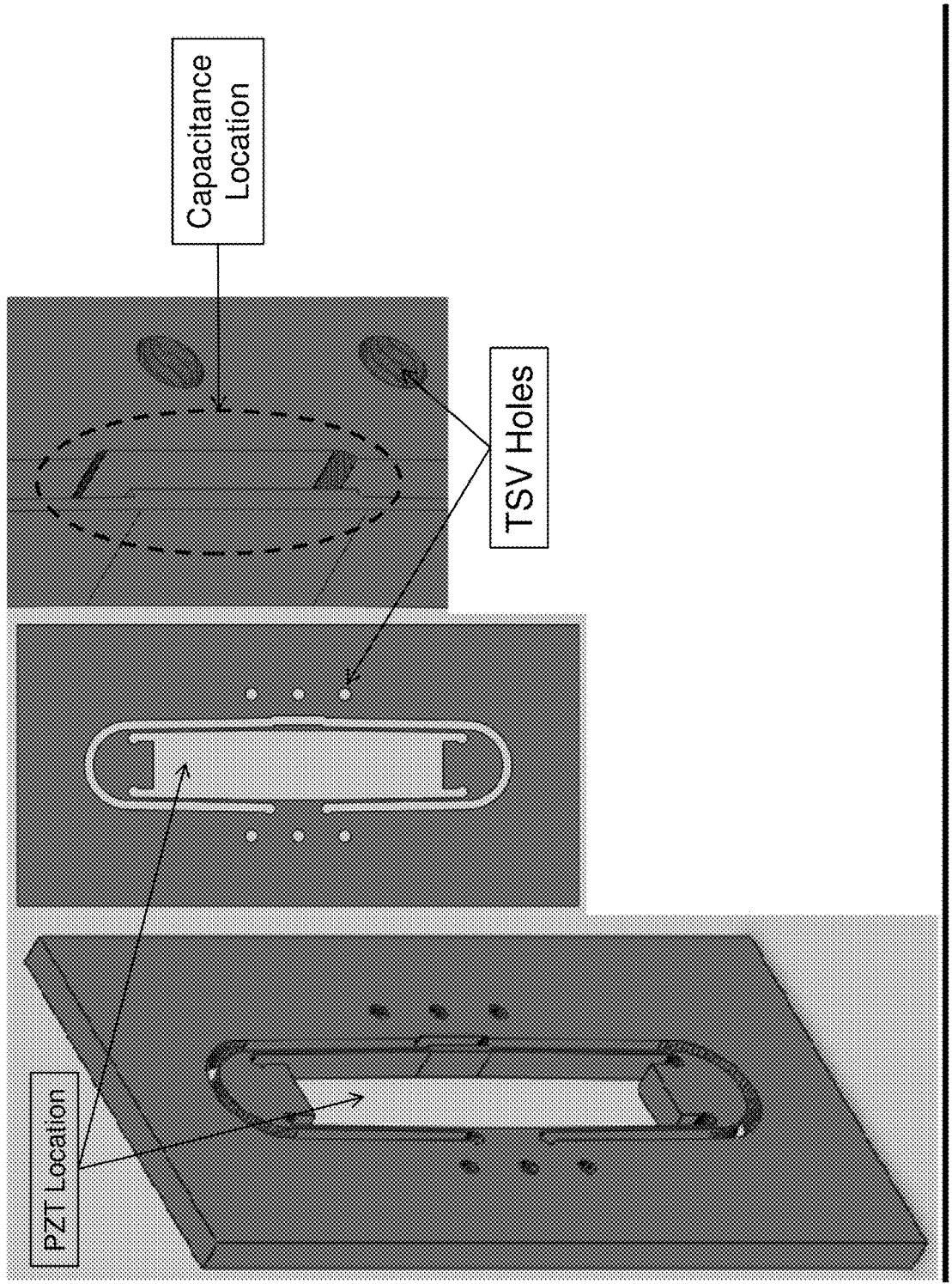

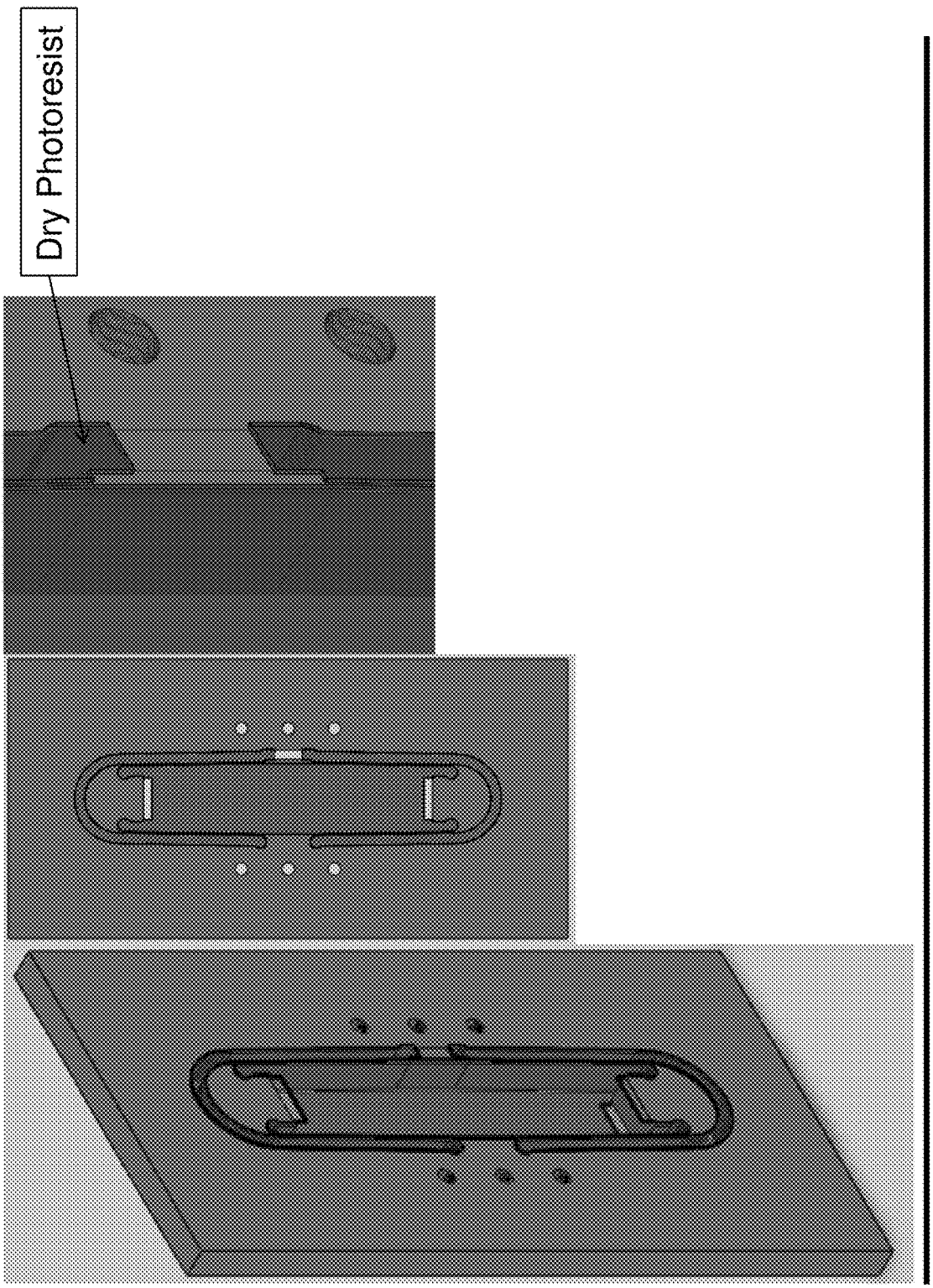
FIG. 6  Pattern Dry Photoresist

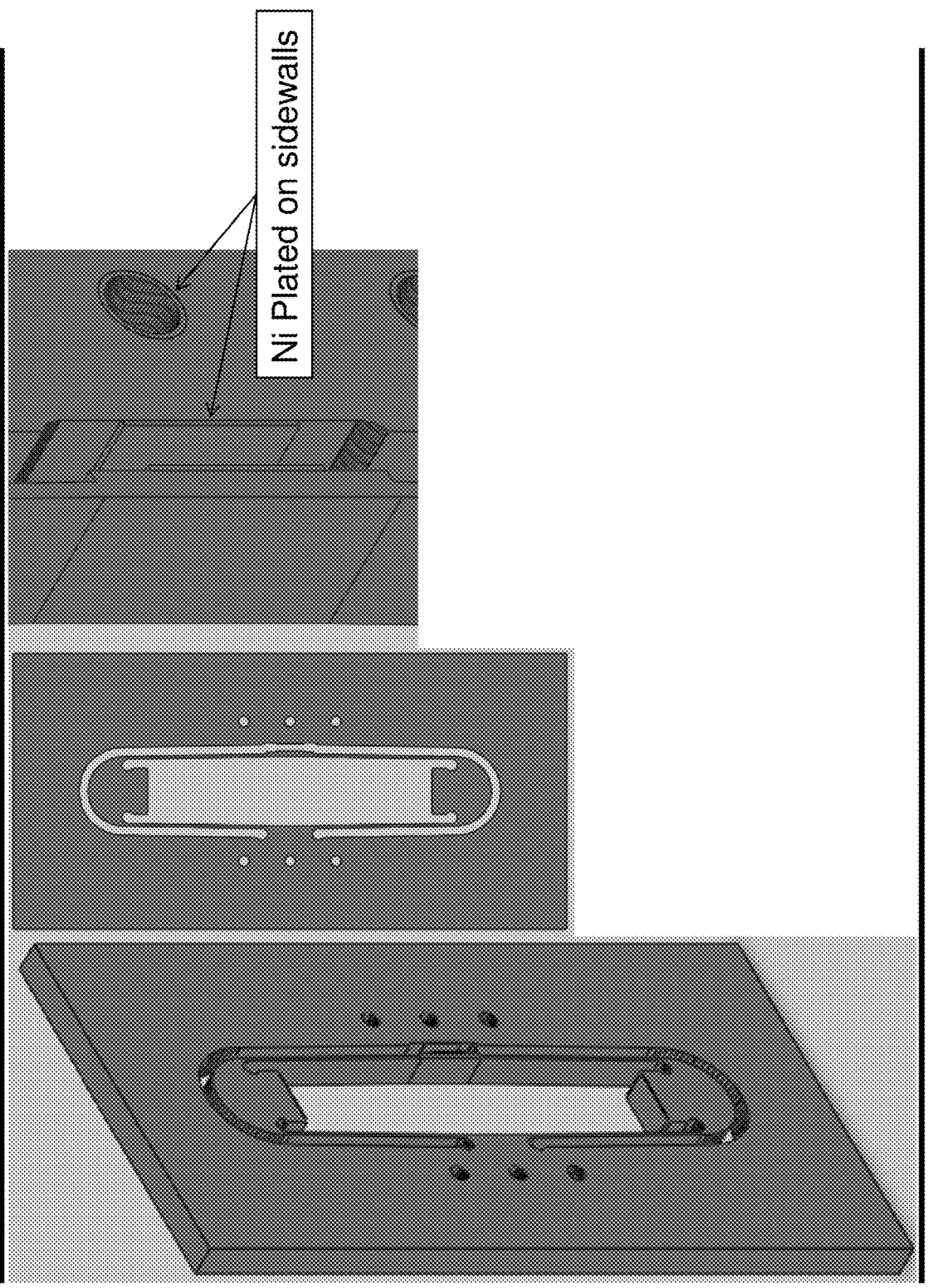

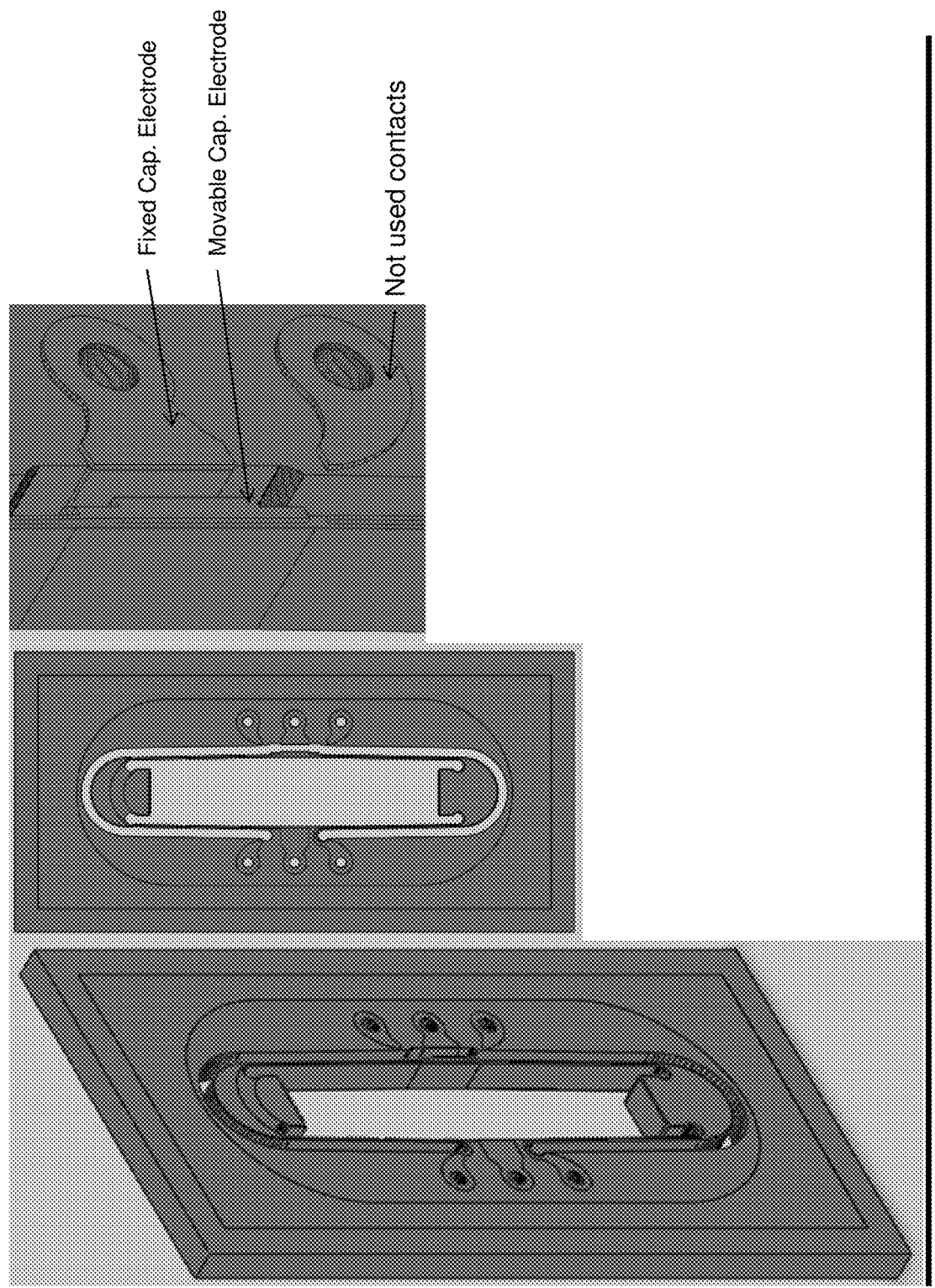

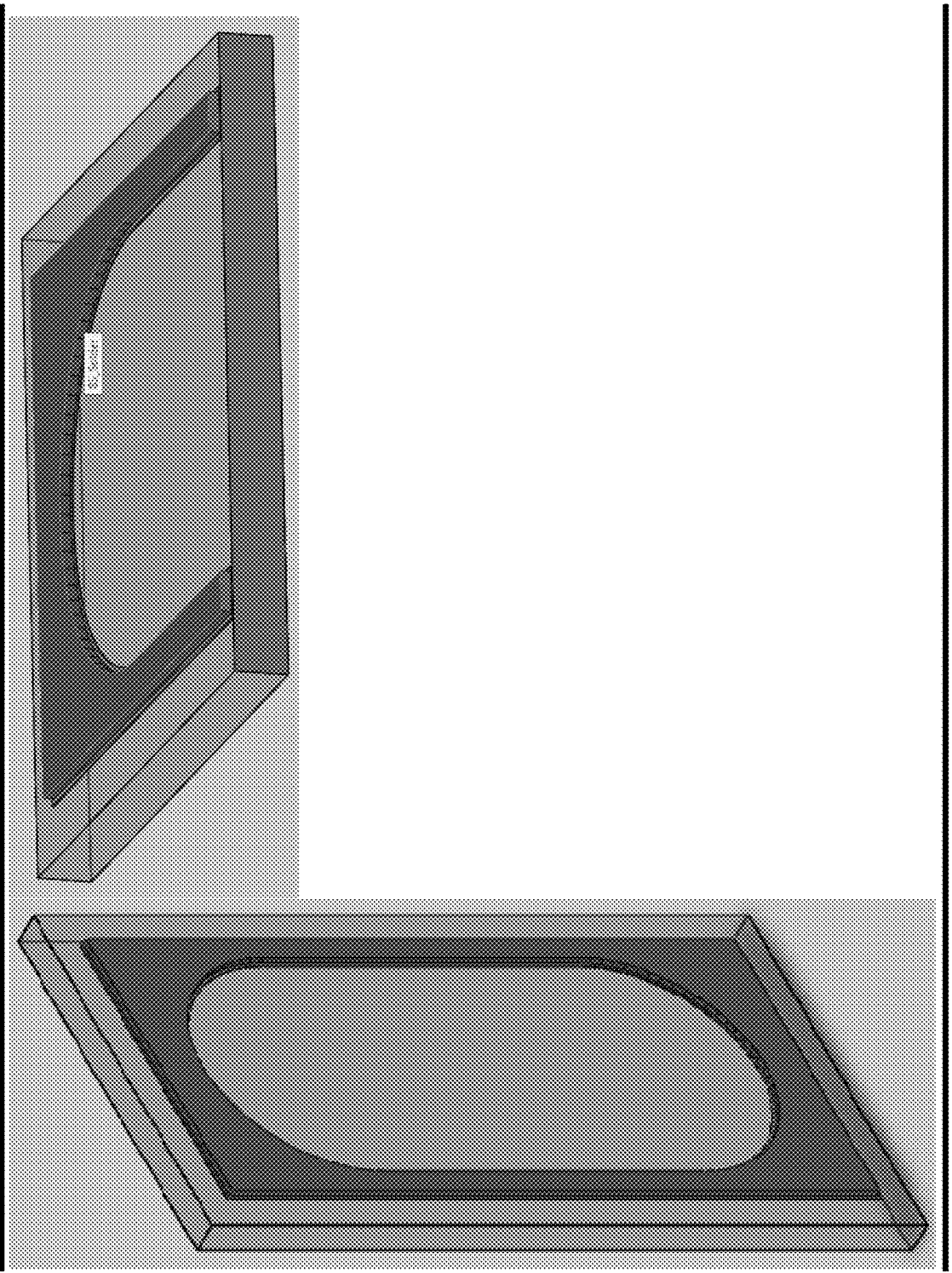
FIG. 10  Backside Glass-Cap Wafer

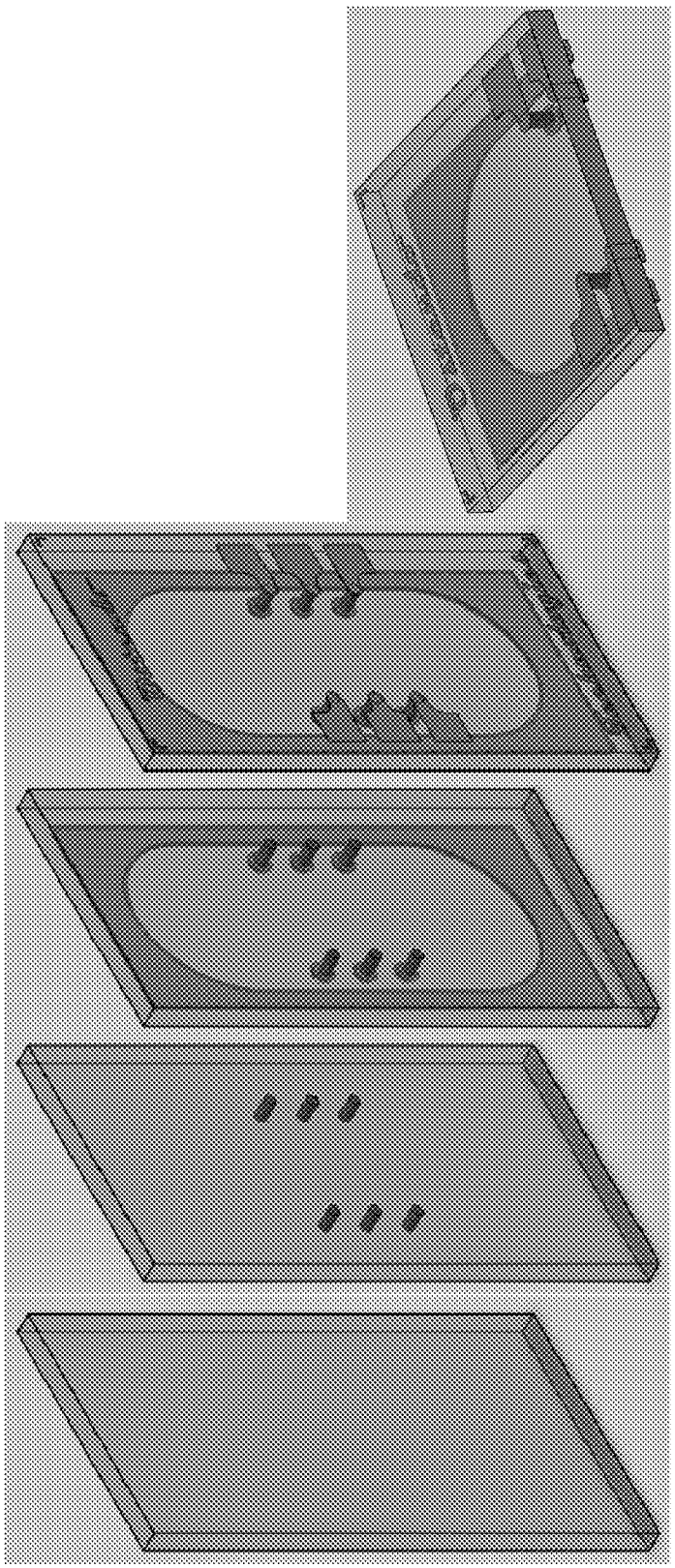
FIG. 11    Top Glass-Cap Wafer

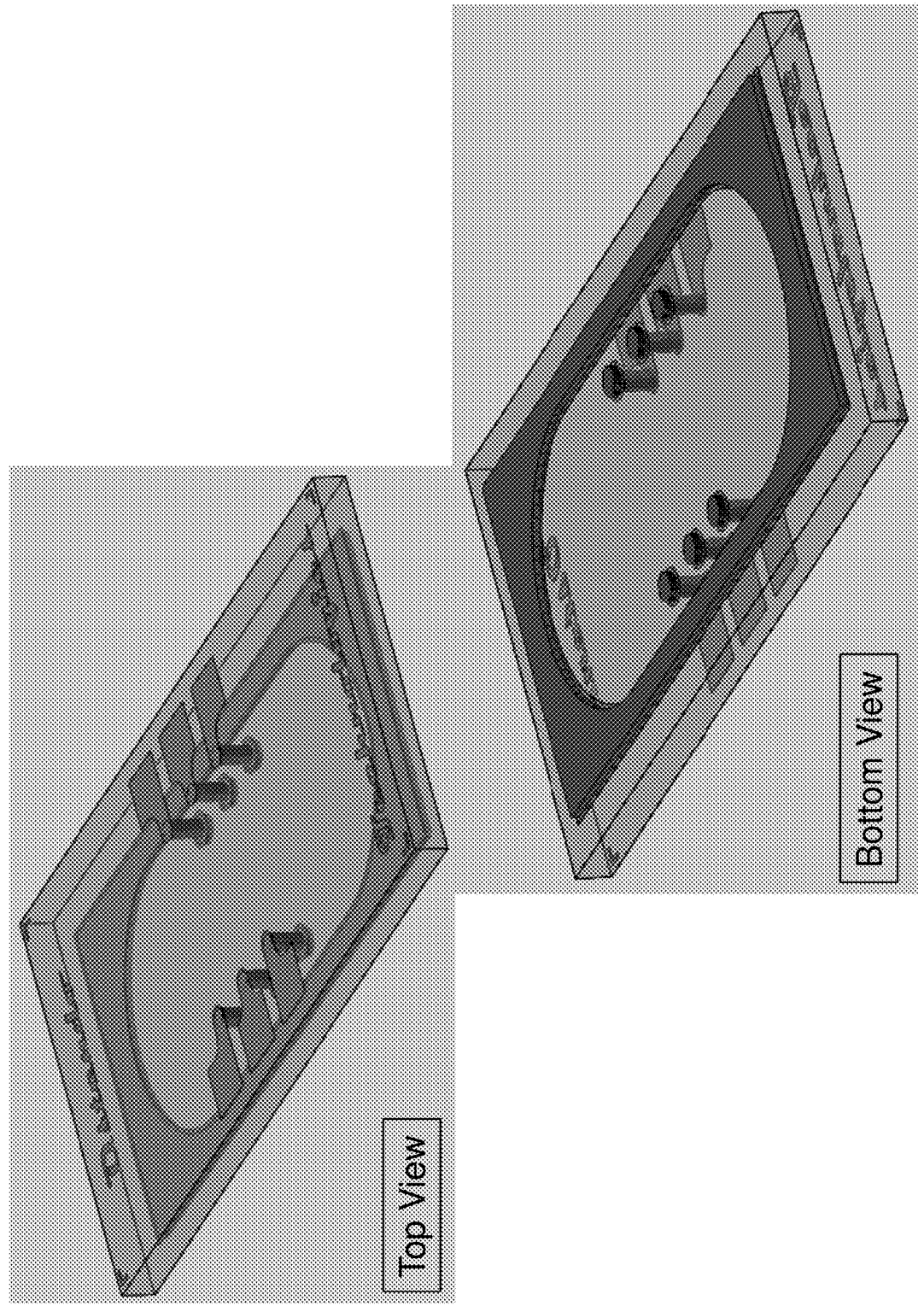
FIG. 12   Top Glass-Cap Wafer

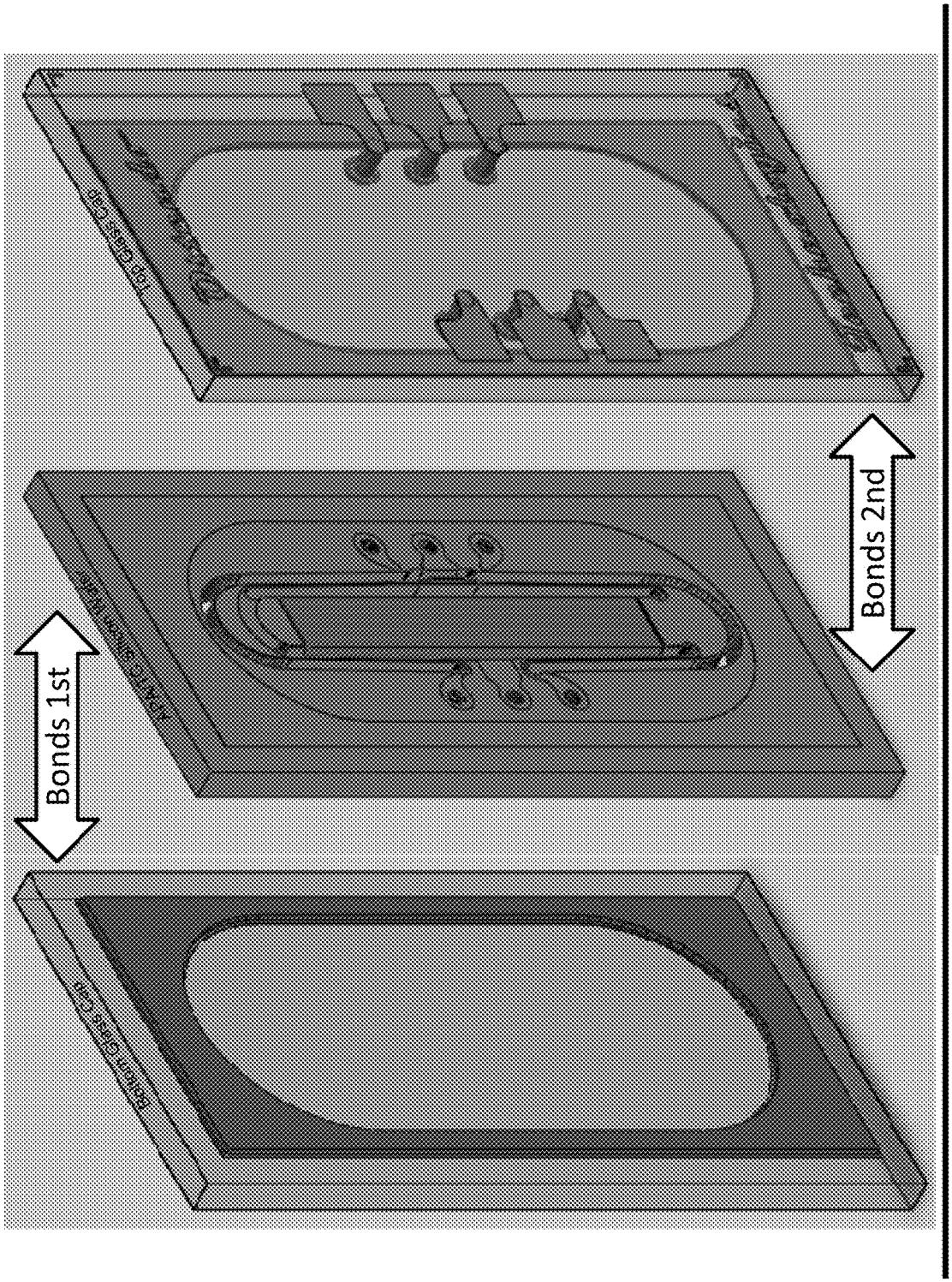
FIG. 13 Eutectic Bonding of Wafers

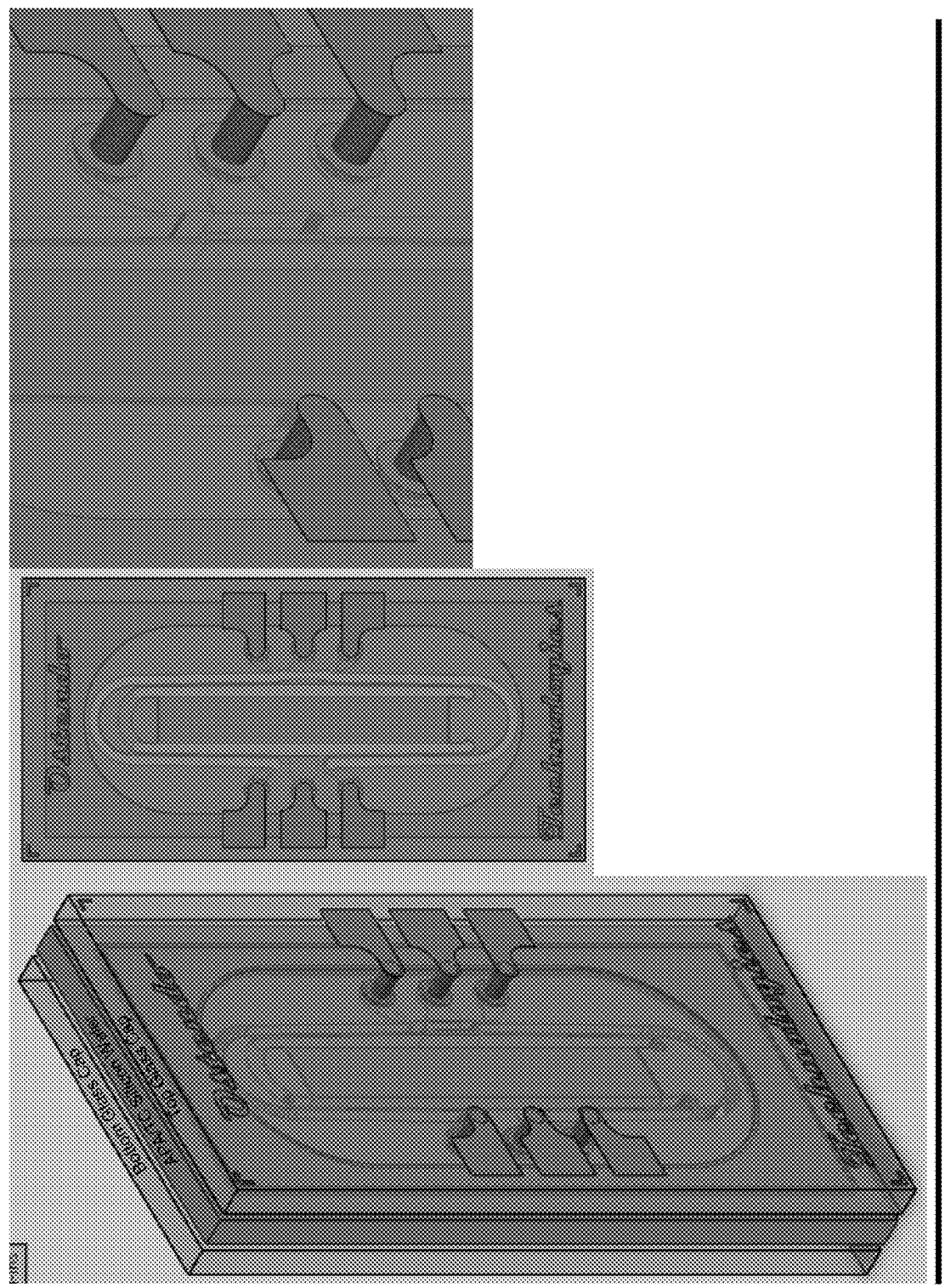

MEMS TUNABLE CAPACITOR COMPRISING AMPLIFIED PIEZO ACTUATOR AND A METHOD FOR MAKING THE SAME

CROSS-REFERENCE TO RELATED APPLICATIONS

This application claims the benefit of U.S. Provisional Application No. 62/822,637 filed on Mar. 22, 2020, the disclosure of which is incorporated by reference herein.

BACKGROUND OF THE INVENTION

1. Field of the Invention

The invention generally relates to the field of electrical capacitor devices.

More specifically, the invention relates to a tunable capacitor that comprises a piezo actuator drive element configured to vary the dielectric distance or gap between a pair of electrically conductive plate elements of an amplified piezo actuator (APA) flexure assembly and thus vary the capacitance of the device using a predetermined or user-defined input voltage signal.

As more fully detailed below, the structure and cooperation of the elements of the invention enable numerous benefits over existing devices including, for instance, no requirement for an electrostatic actuation mechanism, providing a dielectric gap between the opposing capacitive plate elements that is not limited to few microns and may be as wide as 400 um or more, providing a variable dielectric gap that may be increased using a reverse bias to the piezo actuator drive element to permit precise control of the flexure assembly motion and travel of the opposing capacitive plate elements of the device using analog voltage signals.

2. Prior Art

It is well known that a capacitor is generally comprised of two substantially parallel electrically conductive plates that are separated by a dielectric medium such as air or by an insulating layer comprising a dielectric material. In such a structure, electrical current cannot flow through the capacitor and instead a voltage potential is created between the opposing conductive plates in the form of a net negative charge on one plate and a net positive charge on the other plate.

Numerous applications exist for capacitors that are capable of varying their capacitance in the form tunable capacitors. Such tunable capacitors have application in reconfigurable RF power amplifiers and tunable antennae in mobile phone handsets. Tunable capacitors enable electronic circuits to operate at different frequencies, permit antenna and filter tuning and can act to perform as variable impedance matching between circuits. Tunable capacitors also enable wide-band tunable networks, serve to minimize mismatch losses, improve system efficiency and reduce radio system complexity.

One form of prior art tunable capacitor is currently offered by Perigrin Semiconductor and uses metal-insulator-metal or "MIM" capacitor banks in cooperation with FET circuitry that is switched on/off using a bank of switches to obtain a desired capacitance value. The switching of the capacitor banks in this prior art device is performed using PIN diodes which, aside from having large energy losses, also suffer from limited tuning range.

The method in which existing prior art RF MEMS tunable capacitors are designed undesirably dictates that the power amplifiers in a mobile phone application are only able to be tuned to two frequency bands in the form of a two-state capacitor (i.e., high and low capacitance).

Certain companies have sought to exploit MEMS technologies in this field of tunable capacitors including WiSpry, Inc. and Cavendish Kinetics, Inc.

The prior art tunable capacitor devices offered by Wispry are presently limited to a capacitance variance of about 0.3 pF to about 2.9 pF with a tuning range of about 9.7 (where the tuning range of a tunable capacitor is defined as the ratio of the maximum capacitance value of the tunable capacitor to its minimum capacitance value).

The two prior art tunable capacitor devices offered by Cavendesh are limited to a capacitance variance of about 0.5 pF to about 1.65 pF or about 0.75 pF to about 3.10 pF with a tuning range of only about 3.3 but each of which offers a sufficient capacitance variance ranges for certain mobile phone and other applications.

A further prior art tunable capacitor approach taught by Goldsmith, et al., (IEEE MGWL, 1998; Charles L. Goldsmith, Zhimin Yao, Susan Eshelman, and David Denniston, "Performance of Low-Loss RF MEMS Capacitive Switches", IEEE Microwave and Guided Wave Letter, Vol. 8, No. 8, AUGUST 1998) is a shunt capacitor switch assembly that uses a suspended MEMS shunt bridge fabricated over an RF line whereby the MEMS shunt bridge is anchored on its two ends to an RF ground plane.

When the suspended bridge of the above device is actuated by a DC bias voltage, the bridge contacts a silicon nitride layer that covers the RF signal line under the suspended bridge. These switches are primarily used for two state capacitance applications. In this instance, because the bias voltage is inversely related to the plate gap between the bridge and the signal line, the gap is maintained at a small value (<2 um). It is also noted these types of switches tend to suffer from low reliability due to SiNx charging over a long period of switching cycles.

A yet further prior art tunable capacitor approach is disclosed by Rizk, et al. (J. B. Rizk, and G. M. Rebeiz, "Digital-type RF MEMS switched capacitors", IEEE MTT-S International Microwave Symposium Digest, 2002) in the form of a switchable MIM capacitor bank.

In this prior art design, a MEMS shunt bridge is fabricated over an MIM capacitor. When the bridge is in the up-state position, the coplanar-wave guide line is loaded mainly by the up-state MEMS bridge capacitance. When the MEMS shunt bridge is pulled down, the line is loaded by the MIM capacitor. As a result, a digital-type switched capacitor is obtained.

A further prior art MIM capacitor can also be switched on/off using a MEMS cantilever assembly that is anchored on the ground lines as is taught by Ghodsian et al. (B. Ghodsian, P. Bagdanoff and Dan Hyman, "Wideband DC-contact MEMS series switch", Micro & Nano Letter, Vol. 3, pp. 66-69, October 2008). Typically a group of the above MIM capacitors are fabricated and are switched on/off to generate the required capacitance values.

While reliable and robust, a drawback of the above switchable capacitor bank is that an undesirably large number of MIM capacitors must be provided to cover a wide frequency band and, in order to operate at low end of for instance the X-band, a large capacitance value of MIM is required, in turn requiring a relatively large area on the MEMS structure.

A true MEMS-fabricated analog tunable capacitor with high tunability would enable use of a single RF power amplifier for multiple frequency bands but unfortunately there are no present RF MEMS analog tunable capacitor designs that provide this required wide tuning capability.

As is discussed herein, the instant invention addresses the above deficiencies in the prior art and enables a tunable MEMS capacitor that provides a high tuning ratio (>1000); high Q factor values (>200), high RF power handling, microsecond-level tuning speed and a small form factor Additional objectives and advantages of this invention will become apparent from the following detailed description of preferred embodiments thereof that proceeds with reference to the accompanying drawings.

BRIEF DESCRIPTION OF THE DRAWINGS

The invention is illustrated by way of example, and not by way of limitation in the figures of the accompanying drawings in which like reference numerals refer to similar elements.

FIGS. 1A and 1B illustrate a preferred MEMS-based variable or tunable capacitor of the invention whereby the plates of the device are depicted in a first variable capacitance open position (FIG. 1A) and in a second variable capacitance closed position (FIG. 1B).

FIGS. 2A and 2B show a graph of longitudinal travel vs. translational direction (FIG. 2A) with respect to the representative prior art MEMS-fabricated flexure assembly of FIG. 2B and the various elements thereof.

FIG. 5 shows the MEMS process steps relative to the dry reactive ion etching (DRIE) of the APA Structure of the invention.

FIG. 6 shows the MEMS process steps relative to the patterned dry photoresist step during fabrication of a preferred embodiment of the device.

FIG. 7 shows the MEMS process steps relative to the electroplating step used during fabrication of a preferred embodiment of the device.

FIG. 8 shows the MEMS process steps relative to the fabrication of front side metal traces during fabrication of a preferred embodiment of the device.

FIG. 10 shows the MEMS process steps relative to the fabrication of a backside glass cap wafer during fabrication of a preferred embodiment of the device.

FIG. 11 shows the MEMS process steps relative to the fabrication of a top glass-cap wafer during fabrication of a preferred embodiment of the device.

FIG. 12 shows further MEMS process steps relative to the fabrication of top glass cap wafer during fabrication a preferred embodiment of the device.

FIG. 13 shows the MEMS process steps relative to the eutectic bonding of the three wafers during fabrication a preferred embodiment of the device.

FIG. 14 shows the final bonded assembly of a preferred embodiment of the device fabricated by the process steps of the invention.

Figure 3A:
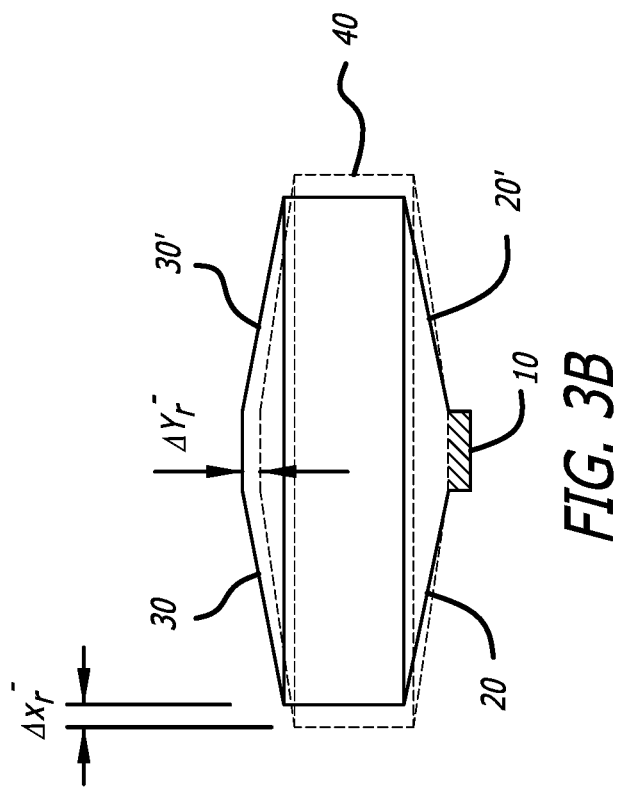
FIGS. 3A and 3B depict a cross-section of a flexure/piezo actuator drive assembly of the invention in first state and a second state showing the piezo actuator drive element and first and second flexures flexibly attached to a base member.

The invention and its various embodiments can now be better understood by turning to the following description of the preferred embodiments which are presented as illustrated examples of the invention in any subsequent claims in any application claiming priority to this application. It is expressly understood that the invention as defined by such claims may be broader than the illustrated embodiments described below.

DETAILED DESCRIPTION OF THE PREFERRED EMBODIMENTS

References in the following detailed description of the present invention to "one embodiment" or "an embodiment" means that a particular feature, structure, or characteristic described in connection with the embodiment is included in at least one embodiment of the invention. The appearances of the phrase "in one embodiment" in various places in this detailed description are not necessarily all referring to the same embodiment.

In the description to follow, references are made to the word groups and those skilled in the art will readily appreciate that various modifications and changes can be applied to the embodiments of the invention without departing from its scope defined in and by the appended claims. It should be appreciated that the foregoing examples of the invention are illustrative only, and that the invention can be embodied in other specific forms without departing from the spirit or essential characteristics thereof.

The disclosed embodiments, therefore, should not be considered to be restrictive in any sense. The scope of the invention is indicated by the appended claims, rather than the preceding description, and all variations which fall within the meaning and range of equivalents thereof are intended to be embraced therein.

In a first aspect of the invention, a micromachined tunable capacitor is disclosed comprising a base member; a pair of first flexures, a pair of second flexures, a piezo actuator drive element, a first capacitor plate element and a second capacitor plate element.

The pair of first flexures and the pair of second flexures are flexibly coupled to the base member and piezo actuator drive element and configured whereby a stress or strain induced by a user-defined voltage signal coupled to the piezo actuator drive element urges the first capacitor plate element a predetermined distance toward or away from the second capacitor plate element proportional to the predetermined voltage signal.

The invention may comprise a configuration wherein each of the first capacitor plate element and second capacitor plate element are urged toward or away from each other by means of a dedicated set of pairs of flexures flexibly coupled to each plate.

In a second aspect of the invention, the second capacitor plate element may be stationary.

In a third aspect of the invention, the predetermined distance between the first and second capacitor plate elements may be varied between 0 and 500 microns.

In a fourth aspect of the invention, the first movable capacitor plate element may be urged in an orthogonal direction relative to the stress or strain induced by the piezo actuator drive element as the result of a predetermined voltage signal.

In a fifth aspect of the invention, at least one sidewall surface of the micromachined tunable capacitor may be processed using a wet thermal oxidation process to define a predetermined sidewall surface characteristic such as smoothness.

In a sixth aspect of the invention, at least one sidewall surface of the micromachined tunable capacitor may be processed with a plasma-enhanced chemical vapor deposition (PECVD) or a low pressure chemical vapor deposition (LPCVD) process.

In a seventh aspect of the invention, at least one of the first capacitor plate element or second capacitor plate element may be comprised of an electrically conductive layer such as a metal that is disposed between a pair of dielectric or oxide layers.

In an eighth aspect of the invention, the electrically conductive layer may be comprised of a nickel, copper or gold material.

In a ninth aspect of the invention, at least one of the dielectric layers may be comprised of a $Al_2O_3$, $SiN_x$, or $SiO_2$ material.

The tunable capacitor is preferably fabricated using a set of microelectromechanical systems ("MEMS") processes using well-characterized semiconductor processing techniques and equipment and bulk silicon micromachining methods.

Turning now to FIGS. 1A and 1B, tunable capacitor 1 is preferably a rhombus-type Si-based flexible compliant mechanism having a pair of opposing flexure hinges, such as is taught by Ling et al. (Mingxiang Ling, Junyi Cao, Minghua Zeng, Jing Lin and Daniel J Inman, IOP, Smart Materials and Structures, "Enhanced mathematical modeling of the displacement amplification ratio for piezoelectric compliant mechanisms", Vol. 25, 2016); "Enhanced mathematical modeling of the displacement amplification ratio for piezoelectric compliant mechanisms").

In the illustrated preferred embodiment of FIGS. 1A and 1B, a base member 10 is provided and is flexibly coupled to first lower flexures 20 and 20' and second upper flexures 30 and 30' that, in turn are driven by a piezo actuator drive element 40. Piezo actuator drive element 40 cooperates with the pairs of flexures 20 and 20' and 30 and 30' which are flexibly coupled to base 10. The pairs of flexures are configured to drive or urge the first capacitor plate element 50 toward or away from second capacitor plate element 60 to vary the distance or gap there between. Because the capacitance of the device 1 is inversely proportional to the distance between the first capacitor plate element 50 and second capacitor plate element 60, a user-defined actuator signal voltage, when applied to piezo actuator drive element 40, can be used to adjust the capacitance of the device 1 itself.

FIG. 2A illustrates selected schematic and geometric parameters of the rhombus-type compliant prior art APA flexure mechanism of Ling et al. that is suitable for use in the instant invention.

FIG. 2B illustrates a static model of Ling et al. of an embodiment of a MEMS-based flexure assembly of the compliant amplified piezo actuator mechanism of FIGS. 1A and 1B.

Figure 3B:
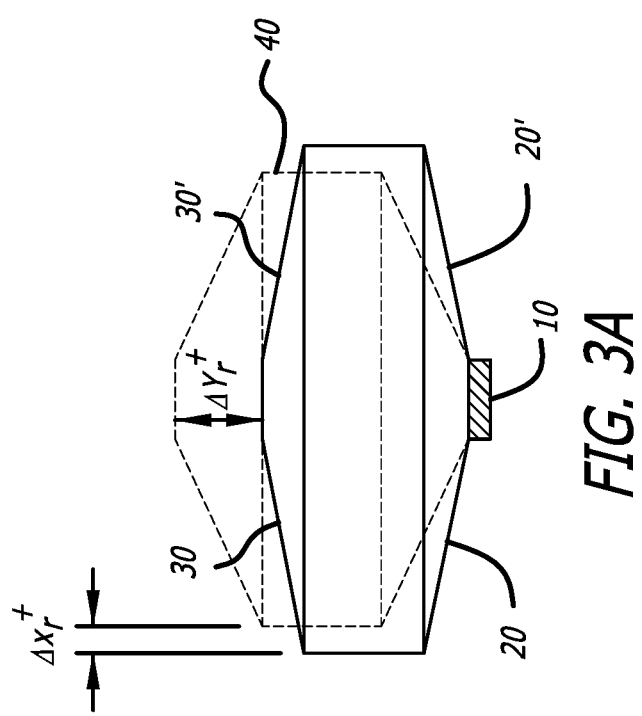

Turning now to FIGS. 3A and 3B and in view of FIGS. 2A and 2B, an exemplar embodiment of tunable capacitor 1 of the invention is illustrated.

Tunable capacitor 1 may be comprised of a base member 10 having first flexures 20 and 20' outwardly and angularly depending from base member 10. The distal ends of first flexures 20 and 20' are flexibly coupled to a piezo actuator drive element 40 at their respective distal ends.

Where $K_r$ and $K_{\theta r}$ are respectively, the translational stiffness, the rotational stiffness of the flexure beam in the prior art rhombus-type compliant design.

Piezo actuator drive element 40 may comprise a piezo electric element configured to extend or contract the length of piezo actuator drive element 40 proportional to an applied voltage signal.

Also flexibly coupled to piezo electric drive actuator 40 are distal ends of second flexures 30 and 30' which are outwardly and angularly depending therefrom.

An exemplar preferred set of specifications and design element variables that may be used to design and fabricate an exemplar flexure assembly of the invention is set forth below:

| Symbols | Descriptions | Values |
| --- | --- | --- |
| $L_r$ | Length of flexure beam | 6 mm |
| h | Thickness of the beam (height) | 0.5 mm |
| d | Width of the flexure beam | 50 um |
| θ | Beam angle | 0.8 |
| E | Young modulus of beam material | 169 GPa |
| $d_{33}$ | Piezoelectric charge constant | $6.5 \times 10^{-10}$ C/N |
| $S_{11}$ | Elastic compliance constant | $1.7 \times 10^{-11}$ |
| V | Voltage across the electrodes | 10 V |

$$R_{amp\ r} = \frac{(K_r L_r^2 - 12 K_{\theta r}) \sin \theta \cos \theta}{12 K_{\theta r} (\cos \theta)^2 + K_r L_r^2 (\sin \theta)^2}$$

Figure 4B:
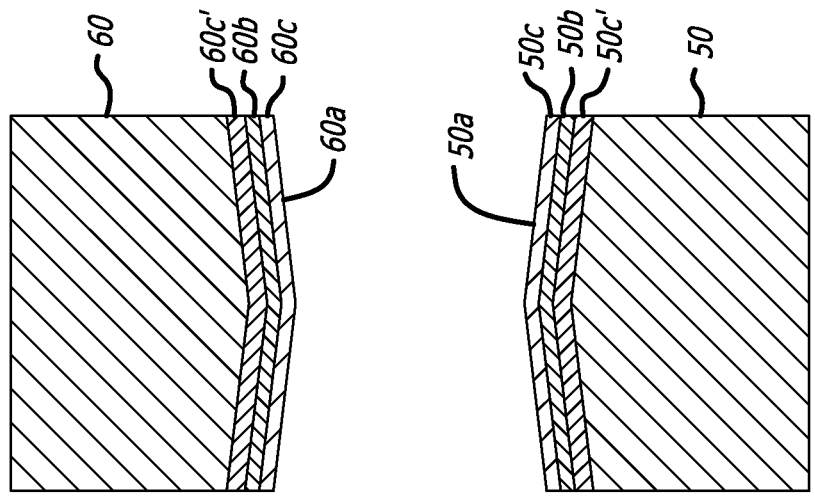
FIG. 4 depicts a further cross-section of a preferred embodiment of the invention showing the oxide and metal electrode layers of material that may be used to fabricate the moveable capacitor plate elements of the tunable capacitor of the invention.
Figure 4A:
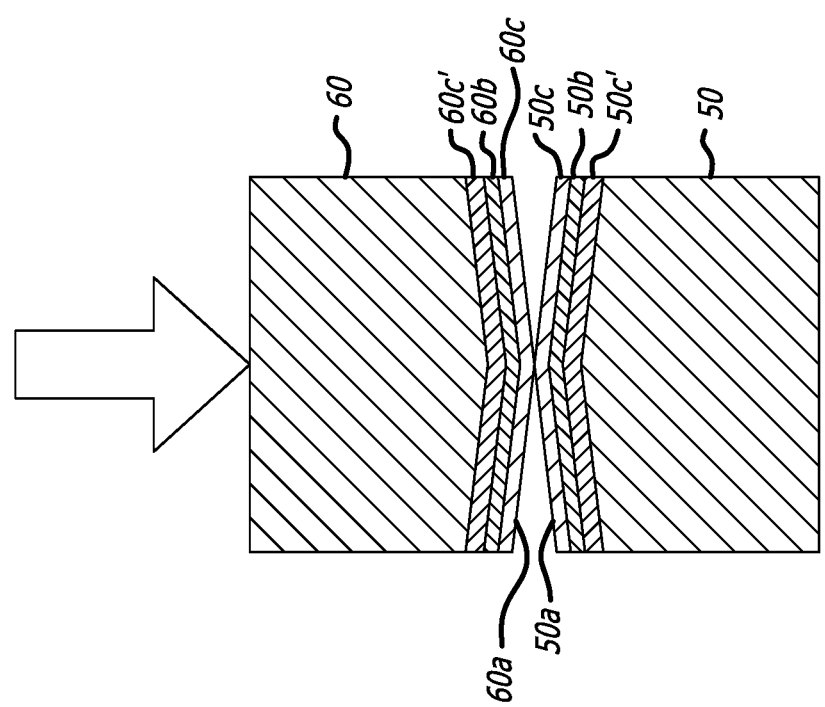
Figure 9:
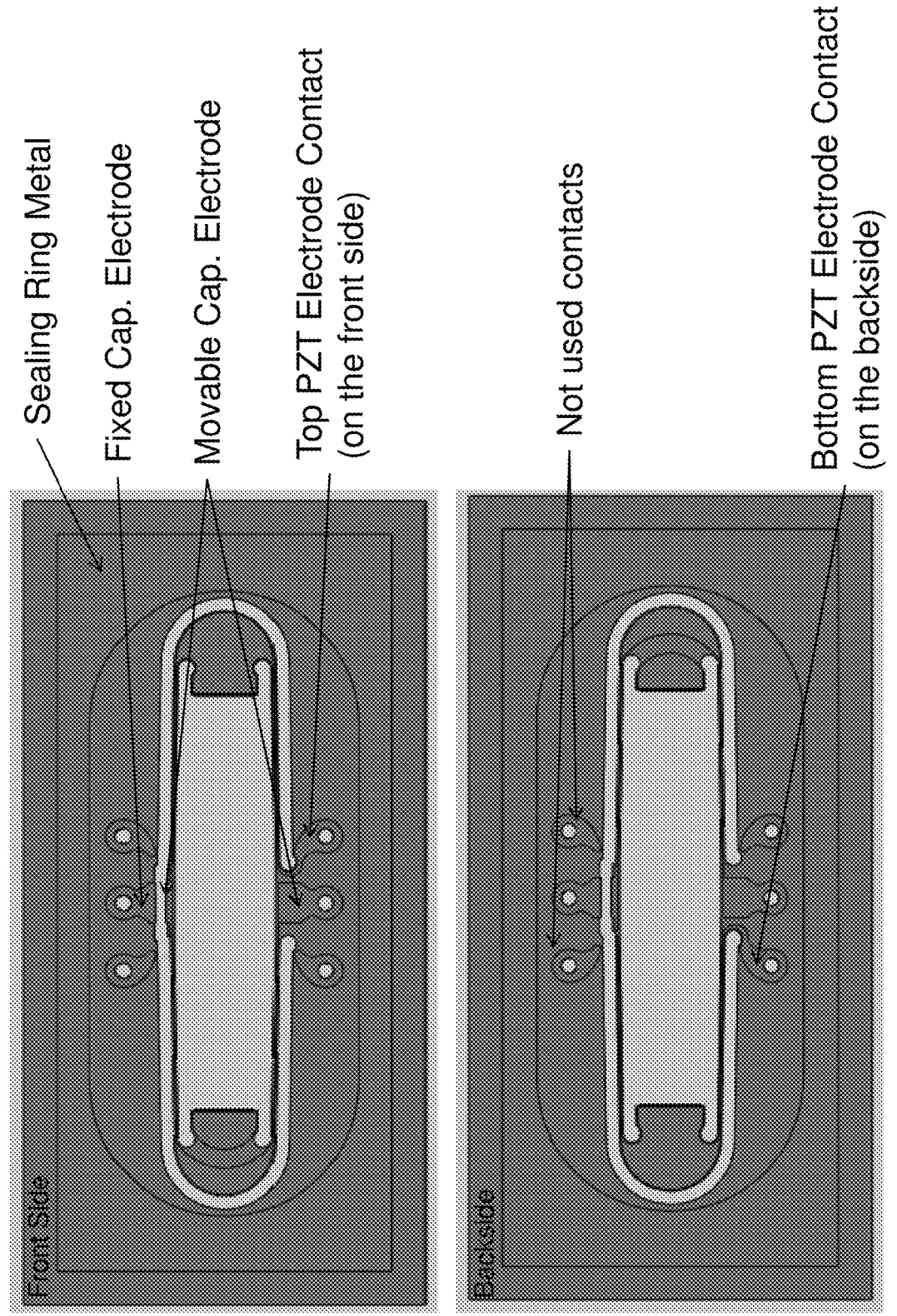
FIG. 9 shows the MEMS process steps relative to the fabrication of a sealing ring during fabrication of a preferred embodiment of the device.

As is illustrated further in FIGS. 4A and 4B, and in view of the previous figures, the distal ends of second flexures 30 and 30' are flexibly coupled to a first capacitor plate element 50. First capacitor plate element 50 may comprise a first plate surface 50a and a first electrically conductive layer 50b disposed between a first pair of dielectric layers 50c and 50c'.

First electrically conductive layer 50b may comprise an electrically conductive metal such as nickel, copper or gold having a thickness ranging from about 2-10 μm. The first pair of dielectric layers 50c and 50c' may comprise an oxide material such as an $Al_2O_3$, $SiN_x$, or $SiO_2$ material having a thickness ranging from about 0.1-0.5 μm.

Tunable capacitor 1 may further comprise second capacitor plate element 60 which may be a stationary element on a surface or may be variably postionable such as by means of an APA drive element which may comprise all or selected elements of a second tunable capacitor 1 structure described above.

Second capacitor plate element 60 may comprise a second plate surface 60a and a second electrically conductive layer 60b disposed between a second pair of dielectric layers 60c and 60c'.

Second electrically conductive layer 60 may comprise an electrically conductive metal such as nickel, gold or copper having a thickness ranging from about 2-10 μm.

The first pair of dielectric layers 60c and 60c' may comprise an oxide material such as an $Al_2O_3$, $SiN_x$, or $SiO_2$ material having a thickness ranging from about 0.1-0.5 μm.

First plate surface 50a and second plate surface 60a are preferably, but are not required to be, aligned so as to have their respective opposing planar surfaces substantially parallel with each other.

As is known, the reverse piezoelectric effect is the internal generation of a mechanical strain in a piezo material resulting from an applied electrical field. In operation, a user-defined or predetermined voltage signal is applied to the piezo element of piezo actuator drive element 40. Depending upon the polarity and magnitude of the applied voltage signal, the length of piezo actuator drive element 40 will increase or decrease, exerting positive or negative force at the respective first and second flexures. The positive or negative force in turn drives the first capacitor plate element 50 approximately orthogonal to the force direction in a positive or negative direction depending on the polarity and magnitude of the voltage signal, thus selectively increasing or decreasing the distance between first plate surface 50a and second plate surface 60a.

The capacitance of a capacitive device may be calculated by the formula:

$$C = \varepsilon_r \varepsilon_0 \frac{A}{d}$$

where:
C: capacitance, in farads;
A: area of overlap of the two plates, in square meters;
εr: relative static permittivity (sometimes called the dielectric constant) of the material between the plates (for a vacuum, εr=1);
$\varepsilon_0$: electric constant (ε0≈8.854×10−12 F·m−1); and;
d: separation between the plates, in meters;

Accordingly, and as can be seen in FIGS. 1A and 1B respectively, as the distance between first plate surface 50a and second plate surface 60a is varied by the varying length of piezo actuator drive element 40, the capacitance of tunable capacitor 1 is proportionally varied.

As the length of the piezo actuator drive element 40 element increases, the maximum force/distance amplification ratio increases and as the length of the piezo actuator drive element 40 increases, the maximum amplification ratio occurs at a smaller angle Generally, the "tuning range" of a tunable capacitor may be defined as the ratio of the maximum capacitance value of the tunable capacitor to its minimum capacitance value. Having the capability of selectively increasing or decreasing the distance or gap between the two capacitor first and second plate elements 50 and 60 ensures a high value for the tuning range of the device.

In typical MEMS machining processes, the side walls of the various Si flexure elements are not always perfectly vertical and smooth and may be left with a scalloped surface. This is undesirable in that smoothness and the vertical angle of the sidewall is important for the reliable operation of the device.

To overcome the above sidewall concern, a preferred approach during the MEMS machining process is to subject the sidewall to wet thermal oxidation to smooth out the sidewall surfaces.

Depositing the sidewall surface with tetraethoxysilane (TEOS) in a PECVD process serves to smooth out the sidewall surface but may not be as good as the oxidation. Sidewall roughness is direct consequence of the Bosch process. Scallop structures are formed when the fabrication tool switches between etching and passivation steps. The level of roughness is generally dependent on the process parameters, mainly the switching times of etching and passivation steps. Post-processing of Bosch-processed wafers to reduce the scallop size and roughness include thermal oxidation and BOE etching the oxide. The thermal oxidation process consumes the sharp edges of the scallops and BOE removes the oxide. For every 1000 A of oxide grown, about 44% of the silicon is converted to oxide. In the absence of a thermal oxidation tool, a user may smooth out the rough sidewalls by depositing a thick layer of TEOS-based oxide by PECVD.

Since the MEMS structures of the device are etched into silicon wafers from opposing sides of the wafer, there will likely be concerns with sidewall angle. The undesirably sidewall angle can add complexity in calculating and estimating the tuning range of the tunable capacitor. The tuning range of the tunable capacitor is the ratio of the total capacitance when first and second capacitor plate element gap is zero to the total capacitance when the gap is at its maximum.

The use of an oxidation process in a set of MEMS fabrication processes assists in enabling smoothing out of sidewall roughness. After performing a deep reactive ion etch (DRIE) step, based on the Bosch process, it is common the sidewall surface is typically not smooth and may comprise small silicon scallop structures.

A preferred method of eliminating or minimizing these scallop structures, in order to smooth out the sidewall, is the use of a wet oxidation step followed by a chemical solution etch such as buffered oxide etch (BOE). The MEMS structure may be required to undergo a number of iterations (oxidation+BOE) of this step to smooth out the sidewall roughness to an acceptable level. A thick wet thermal oxidation process beneficially consumes these small silicon structures during the oxidation process and after one or a set of iterations, will make the sidewall surface very smooth.

Referring now to FIGS. 5-14, an exemplar preferred set of process steps for manufacturing a preferred embodiment of the tunable capacitor 1 of the invention is as follows. While an individual die of a wafer is shown in the various figures, it is contemplated as within the scope of the invention and claims that the process steps below may be performed at a wafer level, the wafer layers bonded at the wafer level and then diced into separate tunable capacitor assemblies.

1. A silicon oxide layer is deposited of 1-2 μm in thickness on each side of a double-side polished 500 μm Si wafer;
2. A layer of photoresist is spin-coated on one side of the wafer and exposed and patterned for the selected device design with a developer agent;
3. The photoresist is appropriately exposed and patterned using a developer;
4. The silicon oxide layer is then dry etched and stopped at the underlying silicon;
5. The exposed silicon is then etched all the way through the thickness of the Si wafer and stopped on the oxide layer on the opposing;
6. The photoresist and oxide are then stripped off of the Si wafer;
7. The Si wafer is then subjected to wet thermal oxidation process to grow few microns of silicon oxide to cover the entire exposed silicon surfaces;
8. A dry photoresist film is attached on both sides of the Si wafer;
9. The dry photoresist is then exposed and developed on both sides of the Si wafer;
10. A thin layer of about 100 Å/500 Å of Ti/NiV is sputtered on both sides of the Si wafer;
11. The dry photoresist is then stripped off in ultrasonic bath;
12. Nickel is then electroplated on the exposed Ti/NiV seed layer with about a 10 μm thickness;

13. A dry film such as is attached on one side of the Si wafer to provide mechanical support for the semi-processed wafer;
14. The opposing side of Si wafer is subjected to chemical mechanical polishing (CMP) to polish off the nickel on the surface of the Si wafer and stop on the oxide layer; what remains is nickel plating on selective locations on the device sidewall;
15. A thin layer of about 100 Å/500 Å of Ti/Au seed layer is then sputtered on both sides of the Si wafer;
16. A dry photoresist film is attached on both side of the Si wafer which is then exposed and developed on both sides of the Si wafer;
17. The unprotected areas are etched off in areas where seed layer is not protected by dry photoresist film;
18. The dry photoresist film is stripped off and the Si wafer cleaned;
19. Nickel/Au is then electrolessly plated at a thickness of about 2.0-3.0 μm on the Ti/Au seed layer.

For purposes of fabricating a capping layer of the device, the starting material may be a standard 500 μm thick ceramic-glass wafers such as a Schott Foturan II wafer or any other readily available ceramic-glass wafer. This wafer will be used to cap the backside of the APA/tunable capacitor wafer;
1. One side of the capping wafer is deposited with Ti/Au seed layer of a thickness of about 100 Å/500 Å);
2. A thick dry photoresist film (e.g., 50 μm) is attached on Ti/Au seed layer;
3. The dry photoresist film is then exposed and patterned with developer;
4. Nickel is electroplated at about a 10 μm thickness on the exposed Ti/Au seed layer, the thickness electroplated nickel is at least 10 μm;
5. A eutectic alloy solder is electrolessly plated on the surface of the exposed Ti/Au layer to ~50 μm thick;
6. The dry film is the stripped off;
7. The seed layer is etched off;
8. What remains is nickel and eutectic solder film, which will function as the sealing ring for the assembly;
9. The Schott Foturan II glass wafer is exposed using a through silicon via (TSV) mask to define desired TSV locations;
10. The glass wafer is put through thermal treatment as recommended by the glass manufacturer;
11. The glass wafer is then etched in a BOE solution (a common buffered oxide etch solution comprises a 6:1 volume ratio of 40% $NH_4F$ (ammonium fluoride) in water to 49% HF (hydrofluoric acid) in water) to etch through the TSV holes;
12. A blanket deposition of Ti/NiV seed layer (e.g., 100 Å/500 Å) is performed followed by copper electroplating, until the TSV holes are filled;
13. The copper is polished off and stopped on the glass wafer. Then, the sealing ring and contact bumps are fabricated;
14. The opposite side of the wafer is deposited with Ti/Au seed layer (e.g., 100 Å/500 Å), followed by thick dry photoresist film attachment of about 15-20 μm;
15. The dry photoresist film is then exposed and patterned with developer, followed by Ni/Au electroplating on seed layer ((2.0-3.0 μm)/(0.4-0.5 μm));
16. The dry film is the stripped off and the seed layer is etched off;
17. The bottom glass cap wafer is aligned to APA/TC Silicon wafer using a mask aligner, and the assembly put in a wafer bonder and pressure is applied at a eutectic temperature of the eutectic alloy. After this wafer bonding step, these two bonded wafers are aligned with top glass cap wafer and put in bonder for the second time and pressure is applied at a eutectic temperature of the eutectic alloy, the three layer bonded wafer is then diced into individual die.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by any claims in any subsequent application claiming priority to this application.

For example, notwithstanding the fact that the elements of such a claim may be set forth in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a subsequent claim must be understood as being generic to all possible meanings supported by the specification and by the word itself.

The definitions of the words or elements of any claims in any subsequent application claiming priority to this application should be, therefore, defined to include not only the combination of elements which are literally set forth, but all equivalent structure, material or acts for performing substantially the same function in substantially the same way to obtain substantially the same result. In this sense, it is therefore contemplated that an equivalent substitution of two or more elements may be made for any one of the elements in such claims below or that a single element may be substituted for two or more elements in such a claim.

Although elements may be described above as acting in certain combinations and even subsequently claimed as such, it is to be expressly understood that one or more elements from a claimed combination can in some cases be excised from the combination and that such claimed combination may be directed to a subcombination or variation of a subcombination.

Insubstantial changes from any subsequently claimed subject matter as viewed by a person with ordinary skill in the art, now known or later devised, are expressly contemplated as being equivalently within the scope of such claims. Therefore, obvious substitutions now or later known to one with ordinary skill in the art are defined to be within the scope of the defined elements.

Any claims in any subsequent application claiming priority to this application are thus to be understood to include what is specifically illustrated and described above, what is conceptually equivalent, what can be obviously substituted and also what essentially incorporates the essential idea of the invention.

What is claimed is:
1. A micro machined tunable capacitor comprising:
a base member;
a pair of first flexures;
a pair of second flexures;
a piezo actuator drive element;
a first movable capacitor plate element;
a second capacitor plate element; and;

the pair of first flexures and the pair of second flexures mechanically coupled to the piezo actuator drive element whereby a stress or strain induced by the piezo actuator drive element urges the first movable capacitor plate element a predetermined distance toward or away from the second capacitor plate element proportional to a predetermined voltage signal whereby a variable dielectric gap is defined between the first and second capacitor plate elements.

2. The micro machined tunable capacitor of claim 1 whereby the second capacitor plate element is stationary.

3. The micro machined tunable capacitor of claim 1 whereby the predetermined distance may be varied between 0 and 500 microns.

4. The micro machined tunable capacitor of claim 1 whereby the first movable capacitor plate element is urged in an orthogonal direction relative to the stress or strain direction induced by the piezo actuator drive element.

5. The micro machined tunable capacitor of claim 1 wherein at least one sidewall surface of the micro machined tunable capacitor has been processed using a wet thermal oxidation process.

6. The micro machined tunable capacitor of claim 1 wherein at least one sidewall surface of the micro machined tunable capacitor has been processed with a plasma-enhanced chemical vapor deposition (PECVD) or low pressure chemical vapor deposition (LPCVD) process.

7. The micro machined tunable capacitor of claim 1 wherein at least one of the first movable capacitor plate elements or the second capacitor plate element is comprised of an electrically conductive metal layer disposed between a pair of dielectric layers.

8. The micro-machined tunable capacitor of claim 7 wherein the electrically conductive metal layer is comprised of a nickel, copper or gold material.

9. The micro-machined electro mechanical system tunable capacitor of claim 7 wherein at least one of the dielectric layers is comprised of a $Al_2O_3$, $SiN_x$, or $SiO_2$ material.

* * * * *